United States Patent
Wang et al.

(10) Patent No.: US 6,401,805 B1
(45) Date of Patent: *Jun. 11, 2002

(54) INTEGRATED VENTING EMI SHIELD AND HEATSINK COMPONENT FOR ELECTRONIC EQUIPMENT ENCLOSURES

(75) Inventors: Gang Wang; P. Keith Muller, both of San Diego; James Leo Knighten, Poway; Joseph Ted DiBene, II, Oceanside, all of CA (US)

(73) Assignee: NCR Corporation, Dayton, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/470,229

(22) Filed: Dec. 22, 1999

(51) Int. Cl.[7] ................................... F28F 7/00
(52) U.S. Cl. .................. 165/80.3; 165/134.1; 165/185; 165/80.2; 361/687; 361/818
(58) Field of Search ............... 165/80.3, 80.2, 165/134.1, 80.1, 185; 361/687, 695, 796, 818

(56) References Cited

U.S. PATENT DOCUMENTS

| | | | |
|---|---|---|---|
| 5,119,270 A | | 6/1992 | Bolton et al. |
| 5,287,292 A | | 2/1994 | Kenny et al. |
| 5,365,749 A | | 11/1994 | Porter |
| 5,473,508 A | | 12/1995 | Porter et al. |
| 5,493,473 A | * | 2/1996 | Yanagi ................. 165/80.3 |
| 5,966,286 A | * | 10/1999 | O'Connor et al. ......... 165/80.3 |
| 6,044,899 A | * | 4/2000 | Langley et al. ......... 165/104.33 |
| 6,109,343 A | * | 8/2000 | Langley et al. ......... 165/104.33 |

* cited by examiner

Primary Examiner—Christopher Atkinson
(74) Attorney, Agent, or Firm—Gates & Cooper

(57) ABSTRACT

An electromagnetic shielding and/or containing heatsink with venting capabilities, comprising a heatsink block, an aperture, and a thermal coupler, is disclosed. The heatsink comprises a thermally conductive material. The aperture is coupled to the heatsink block and allows a thermal carrier to pass from a first side of the heatsink block to a second side of the heatsink block. The aperture is sized to prevent at least a first electromagnetic frequency lower than a cutoff frequency from passing through the aperture. The thermal coupler is coupled to the heatsink block and couples the heatsink block to a heat source.

12 Claims, 2 Drawing Sheets

INTEGRATED VENTING EMI SHIELD AND HEATSINK COMPONENT FOR ELECTRONIC EQUIPMENT ENCLOSURES

BACKGROUND OF THE INVENTION

1. Field of the Invention

This invention relates in general to heatsink components, and in particular to an integrated venting, electromagnetic interference (EMI) shield and heatsink component for electronic equipment enclosures.

2. Description of Related Art

Modern computing systems generate significant heat within chassis enclosures and simultaneously generate EMI. As chip clock speeds, and power and circuit densities increase, heat generation by these components also increases, making cooling of the devices more difficult. To maintain reliable operation and data integrity for such systems, effective thermal management in the design is required.

At the same time, as clock and data speeds increase, the generation of EMI increases significantly. Worldwide regulatory rules require certification of electromagnetic compatibility (EMC) prior to shipment of systems.

Conventional methods of thermal management and EMI containment are often at odds in the design of chassis enclosures. To ensure designed performance and reliability, heat generated by active electronic and integrated circuit (IC) components is typically removed through convective heat transfer by forcing cooling air or other thermal carriers to flow past the active component surface. More effective heat removal can generally be achieved by having a higher airflow velocity flowing past the heat transfer surface. To further improve cooling capacity, extended heat transfer surfaces, such as a heatsink, may be attached to the component to increase the convective heat transfer from the component to the thermal carriers. Therefore, for a given exposed surface area and a fixed air moving device, the maximum cooling capacity can be achieved when the extended surface area is maximized and the airflow impedance offered by enclosure walls is minimized. As such, thermal management solutions employing air cooling technologies require venting panels with large number of ventilation apertures of substantial size or open designs in electronic chassis enclosures.

EMI containment, on the other hand, usually requires small apertures, or no openings at all in enclosure walls for effective EMI shielding, because ventilation apertures, when made of electrically conductive materials, behave as waveguide structures in electromagnetic terms. In general, electromagnetic waves propagate through a waveguide as long as the frequency of the wave is higher than the cutoff frequency of the waveguide. The geometry of the cross section of the waveguide determines the cutoff frequency of the waveguide. Below the cutoff frequency, electromagnetic waves do not propagate and are highly attenuated.

Further, the length of the waveguide structure determines the degree of attenuation of frequencies below the cutoff frequency. In practice, for rectangular waveguides, lengths greater than the widest portion of the waveguide are required to achieve desired attenuations. For circular waveguides, lengths greater than the diameter are usually required to provide needed attenuation. For waveguide structures of other cross sectional shapes, e.g., any closed polygon, the length is usually required to be longer than the widest cross sectional dimension. Therefore, apertures on enclosure walls, especially on the venting panels, can form an effective EMI barrier when the aperture size is so small that most frequencies associated with electromagnetic interference are below the cutoff frequency, and/or the aperture length is so deep that desired attenuation can be achieved.

Sample calculations for determining the cutoff frequency of a few common waveguides are as follows. For a circular cross-section waveguide, the cutoff frequency is determined by:

$$f_{cutoff} = \frac{1.841}{2\pi a \sqrt{\varepsilon \mu}},$$

where $f_{cutoff}$=cutoff frequency in Hertz, a=diameter of the circular aperture in meters, $\varepsilon$=permittivity of the media within the waveguide, and $\mu$=permeability of the media within the waveguide.

For a circular cross-section waveguide filled with air, the cutoff frequency is determined by:

$$f_{cutoff} = \frac{5.523 \times 10^8}{2\pi a} \text{ Hz}.$$

For a rectangular cross-section waveguide filled with air, the cutoff frequency is determined by:

$$f_{cutoff} = \frac{1.5 \times 10^8}{b},$$

where b=width of waveguide in meters, where the width of the waveguide is greater than the height of the waveguide.

An optimal solution to the cooling and EMI design problems must simultaneously address seemingly fundamental design conflicts between thermal management involving increasing heat dissipation and associated difficult thermal management design issues and EMI containment involving increasingly severe EMI radiation and agency certification design issues.

Moreover, packaging often requires extensive thermal and electromagnetic analysis to determine if electronic components within an enclosure will be adversely affected by the environment both inside and outside of the enclosure in which the components will be operating. For example, some components are very sensitive to EMI, and, as such, must be shielded. Similarly, because of dense packing and higher power outputs, cooling of certain high power electronic components may be best achieved if thermal interference created from heat removal of neighboring components can be minimized.

It can be seen, then, that there is a need in the art for components that can provide EMI containment and/or shielding while still providing adequate cooling or venting for heat generating components. Further, there is a need in the art for components that can provide the containment and/or shielding and cooling characteristics while maintaining low cost electronic enclosures.

SUMMARY OF THE INVENTION

To overcome the limitations in the prior art described above, and to overcome other limitations that will become apparent upon reading and understanding the present specification, the present invention discloses an EMI shielding heatsink with venting capabilities, comprising a heatsink block having at least one aperture, at least one thermal plate attached to at least one heat dissipating electronic component, and at least one thermal coupler thermally connecting the heatsink block and the thermal plate. The heatsink block comprises a thermally and electrically conductive material. The apertures are an integral part of the heatsink block, or are thermally and electrically coupled to the heatsink block, and allow a thermal carrier to pass from a first side of the heatsink block to a second side of the heatsink block The apertures are sized to prevent electromagnetic frequencies lower than the cutoff frequency associated with the aperture structure from passing through the apertures. The thermal plate is made of a thermally conductive material or device. The thermal coupler is made also of a thermally conductive material or device that thermally and mechanically connects the heatsink block to the thermal plate.

An object of the present invention is to provide components that can provide effective EMI shielding while still providing adequate cooling and venting for heat generating components. Another object of the present invention is to provide components that can provide the shielding and cooling characteristics while maintaining low cost electronic enclosures.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to the accompanying detailed description, in which there is illustrated and described specific examples of a method, apparatus, and article of manufacture in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

Figure 1A:
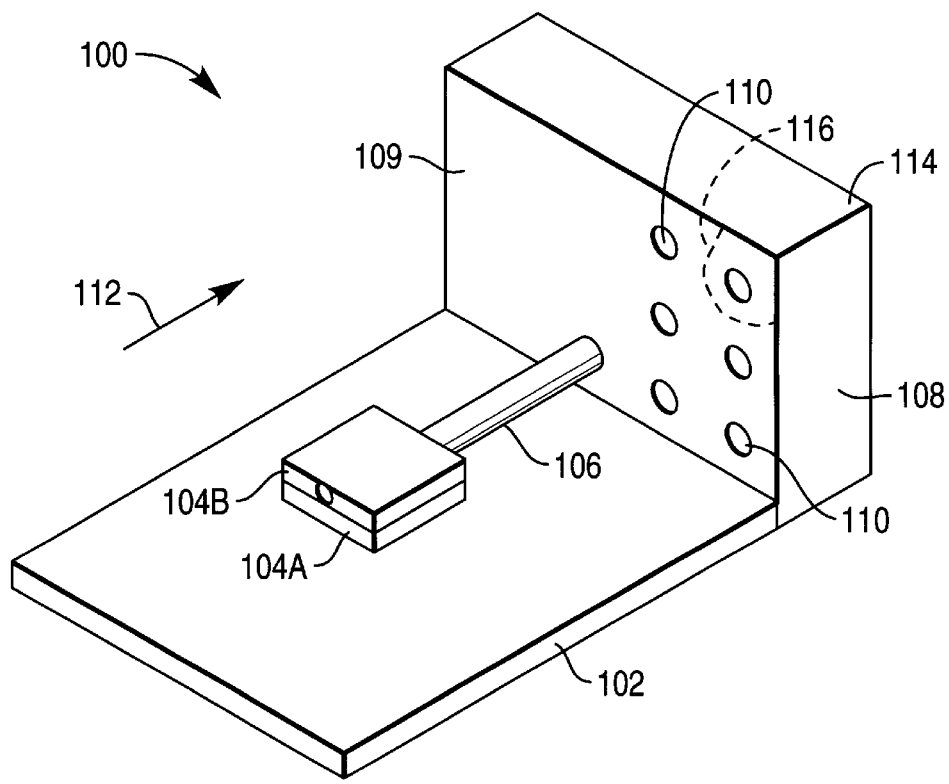
FIGS. 1A–1C illustrate a typical application of the component of the present invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.
Overview The present invention discloses a multifunction component that provides EMI containment and/or shielding, in conjunction with thermal venting and heat sink characteristics, to electronic components within an electronic enclosure.

The basis for the present invention is the merger of the thermal management technology by use of the concepts of conduction and convection, and electromagnetic shielding technology by use of shielded enclosures with electromagnetically filtered ventilation access.

Conventional enclosure design involving air-cooling technologies often results in confrontation between EMI and thermal requirements. EMI containment requires a small number of small-diameter venting apertures while thermal dissipation requires a large number of large-diameter venting apertures. By bringing the heatsink into an integrated venting/EMI shielding structure, the EMI and thermal aspects of the enclosure design can be complementarily implemented in cases where the vent free opening area is fixed. The larger surface area realized by using a larger number of smaller apertures and thicker material surrounding the venting apertures improves the EMI aspect at the same time.

FIG. 1 illustrates a typical application of the component of the present invention. As shown in FIG. 1, circuit board assembly 100 comprises a circuit board 102, a heat generating component 104A, a thermal plate 104B, a heat pipe 106, and multifunction component 108. Multifunction component 108 is typically used as a venting panel of a chassis enclosure, but can be other panels or components. When the assembly 100 is placed in an enclosure, whether it is a card cage, equipment rack, cabinet, or other type of electronic enclosure, the heat generated by component 104A must be dissipated to ensure designed performance and reliability. When forced air-cooling technology is used, more effective heat removal can be accomplished by employing larger extended heat transfer surface and/or higher airflow velocity which will require larger and more venting apertures.

However, EMI emitted from board 102 and other components 104A must also be shielded to comply with regulations and to ensure performance. EMI containment is typically accomplished by limiting the size of openings or apertures on the enclosure walls with the best EMI containment results achieved by having a closed enclosure design. Additionally, some components within the enclosure are very sensitive to EMI, and, must be shielded from EMI emissions from outside the enclosure.

This dilemma of EMI shielding and heat dissipation/removal forces the designer to select venting characteristics in conjunction with EMI shielding requirements and thermal requirements. Designers typically err on the side of increased EMI shielding at the expense of decreased heat dissipation, because EMI effects are typically more degrading to circuit performance and are crucial to EMI regulatory compliance. Thus, component 104A must suffer from less than optimal heat dissipation.

The present invention combines the EMI shielding effects of multifunction component 108 with heat dissipative and venting characteristics to provide component 104A with an increased heat dissipative environment while maintaining and improving the EMI shielding requirements. Multifunction component 108 accomplishes this task by using vent holes 110 with increased depth traveling through multifunction component 108 and having a diameter small enough to prevent electromagnetic frequencies lower than the cutoff frequency from passing through, yet still allowing communication of thermal carriers, such as a cooling fluid or airflow 112, from both sides of the multifunction component 108.

Multifunction component 108 is typically a replacement for some of the vents of the enclosure, whether it is a card cage or an equipment rack. Heat pipe 106 is used to thermally connect component 104A and multifunction component 108 and can be mounted such that it is detachably attached to multifunction component 108, to allow for ease of removal and decoupling of circuit board 102 from component 108.

The multifunction component 108, generally made of a thermally and electrically conductive material, has extended surfaces 114 surrounding the apertures 110 and a heatsink block 109 that typically defines a planar surface. The apertures 110 can be in any angular relationship to the heatsink block 109, but preferably are in a perpendicular relationship with reference to the heatsink block 109. Although shown as a single piece of material, multifunction component 108 can be made from a single plate 200 with pipes 202. Plate 200 and pipes 202 are typically made of thermally and electrically conductive materials, and are electrically and thermally bonded together such as illustrated in FIG. 2, or other methods, to provide a similar structure to that shown in FIG. 1.

The thickness of the material 116 surrounding each venting aperture 110 is designed to provide adequate heat transfer area such that, in conjunction with available airflow stream 112, required heat removal from component 104A can be achieved. Surface area in this particular case is referred to the area that is in contact with cooling airflow and can be represented as:

$$\text{surface area per aperture} = 2\pi r t,$$

where r is the venting hole radius and t is the thickness.

For a given thickness and a fixed opening area ratio which is defined as total open area divided by total cross section, larger heat transfer area can be achieved by having more venting holes with smaller size. As an example, given a cross section area of 1" by 1" and 0.25" thick and an opening area ratio of 40%, one round hole will have a radius of 0.357" and a total exposed surface area of 0.56 in$^2$ whereas four round holes will have a radius of 0.178" and a total exposed surface area of 1.12 in$^2$.

The multifunction component 108 in accordance with the present invention therefore acts a heatsink for component 104A. Cooling air passing through venting apertures 110 forms a forced convection cooling mechanism for component 108, which provides cooling to component 104A through heat pipe 106. The thermal carrier used with component 108 is typically air, however, any cooling liquid, such as water, other liquid, other gas such as nitrogen, or vapor can be used to provide cooling to component 108. The heat pipe 106 can also be replaced with a thermally conductive material.

Further, component 104A can be mounted directly onto component 108 to allow direct thermal connection between component 104A and component 108. Other couplings between component 104A and component 108 are also possible with the present invention, since the EMI emissions of component 104A are contained by component 108.

Since the total heat transfer area is also directly proportional to the thickness, having more venting holes with smaller size with increased thickness will not only increase cooling capacity but also will improve EMI shielding capabilities by preventing EMI leakage from the venting aperture 110 for wider frequency ranges. Since EMI shielding capability is enhanced by having smaller and deeper apertures, open area ratio or total opening area can be made larger than normally allowed while still meeting EMI shielding requirements. As such, the multifunction component 108 provides low impedance venting for the enclosure, and component 108 performs effectively as a heatsink and an EMI shield by providing high cutoff frequency and strong attenuation of electromagnetic waves.

Figure 1B:
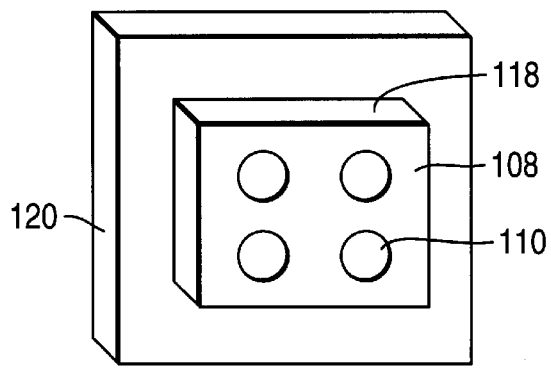
Figure 1C:
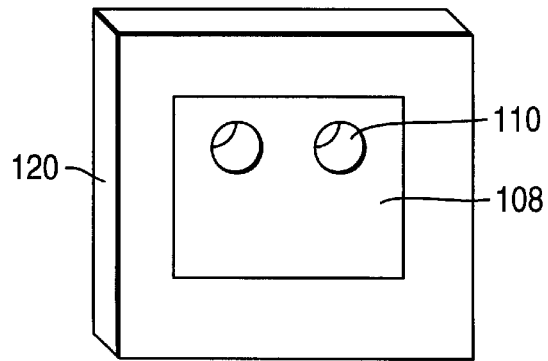
Figure 2:
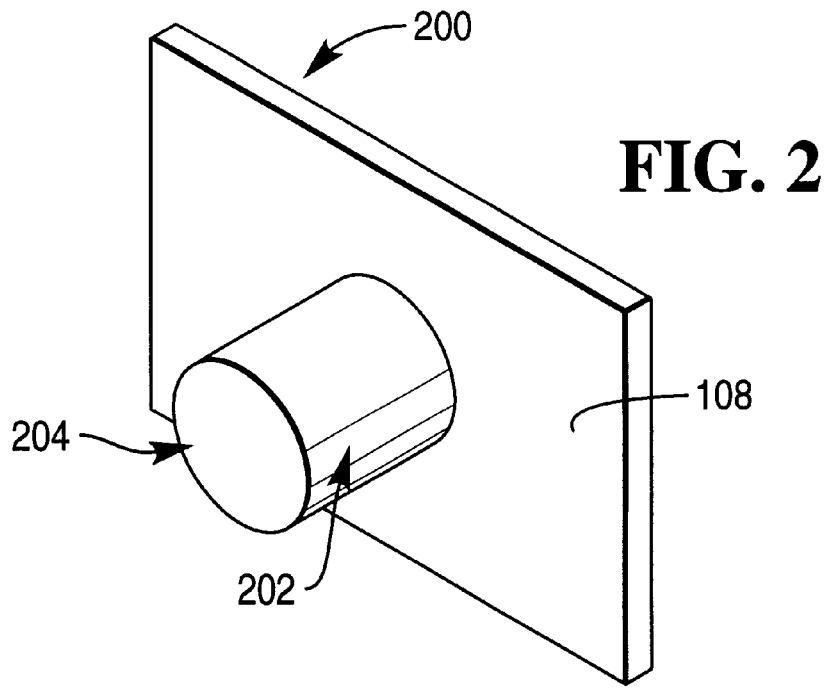
FIG. 2 illustrates a preferred configuration of the present invention.

FIGS. 1B–1C illustrate embodiments of the present invention. FIG. 1B illustrates multifunction component 108 installed in enclosure 120. Enclosure 120 can be an equipment rack, card cage, cabinet, or other electronic enclosure. As shown, the source of EMI can be inside of enclosure 120, or outside of enclosure 120 to either contain the EMI that is generated by component 104A or to shield component 104A from EMI generated elsewhere. Surface 118 that is not in the airflow stream can dissipate heat to the outside of enclosure 120 through free convection and/or radiation in the configuration shown in FIG. 1B.

FIG. 1C illustrates multifunction component 108 having a flush surface with the rear surface of enclosure 120. As shown, the source of EMI can be inside of enclosure 120, or outside of enclosure 120, to either contain the EMI that is generated by component 104A or to shield component 104A from EMI generated elsewhere.

As shown in FIGS. 1A–1C, the venting aperture 110 through multifunction component 108 can be extruded, cast, drilled or manufactured through other technologies to provide the required depth of aperture 110. The venting apertures 110 form electromagnetic waveguides that cannot transmit EMI energy below a certain frequency called the "cutoff" frequency. The cutoff frequency is determined by the venting aperture 110 geometry. Because the venting apertures 110 are small in size, the cutoff frequency is higher than most EMI energy generated by components 104. This allows multifunction component to contain any EMI generated by components 104 within an enclosure, while still allowing venting for heat generated by components 104 within the enclosure. Further, if component 104A is sensitive to EMI generated by other components, multifunction component 104A prevents EMI generated external to the enclosure around component 104A to reach component 104A, and thus provides an EMI shield to component 104A. Although multifunction component 108 would appear porous to the eye, and porous to thermal carriers that can pass through the multifunction component 108, multifunction component 108 would appear as a solid surface to EMI, and reflect the EMI that impinges on the surfaces of multifunction component 108.

Cooling is also enhanced through methods other than large heat transfer surface and high airflow velocity by the multifunction component 108. A typical heatsink attached to an IC within a chassis enclosure often times receives limited amounts of cooling air due to airflow bypass created by increased pressure drop or impedance caused by heatsink fins. However, the multifunction component 108 is designed to receive all cooling air that is being pushed through by the system fans. As such, multifunction component can be more strategically located and can function more efficiently than a typical heatsink. With the extended surface area made available by large number of venting apertures 110 having an extended depth, the effectiveness and efficiency of a chassis panel incorporating multifunction component 108 is much higher than conventional heatsinks can achieve.

FIG. 2 illustrates another preferred configuration of the present invention. The component 108 comprises a base plate 200, and a pipe 202 with an aperture 204. The pipe 202 extends away from the base plate 200 and surrounds the venting apertures in the base plate 200. The pipes allow for air flow, but restrict the EMI from entering the enclosure because of the small aperture size of pipe 202. Both base plate 200 and pipe 202 are made preferably of electrically and thermally conductive materials and are electrically and thermally bonded together.

Alternatively, multiple heat pipes instead of single heat pipe can be employed for heat dissipating electronics and/or IC components. Devices employing heat pipe technologies in shapes and forms other than circular tubes can also be used. Further, the heat pipe can be replaced with a thermally conductive material or other device. As such, the venting component as described is multi-functional; it provides venting for the enclosure, and it performs effectively both as a heatsink and an EMI shield.

Process

Figure 3:
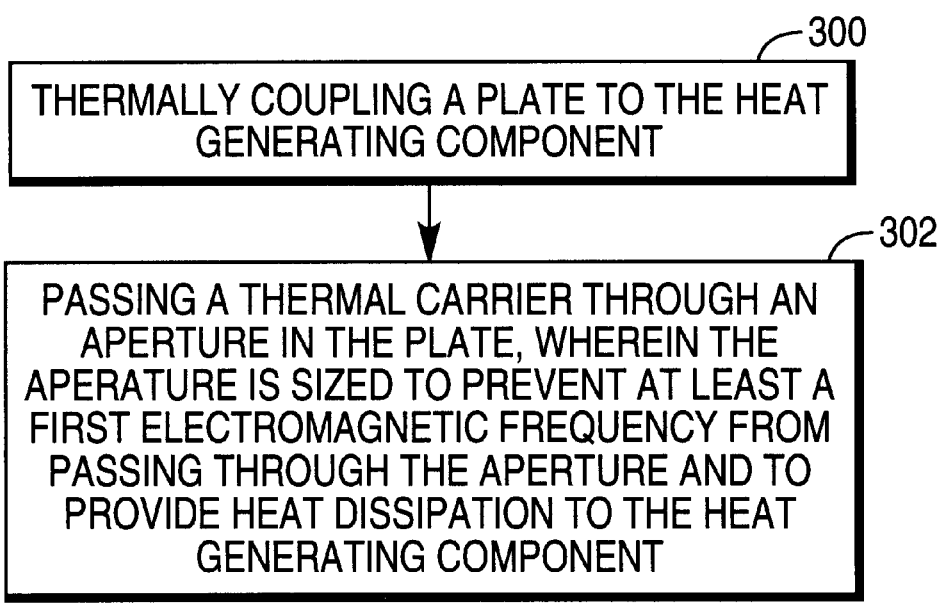
FIG. 3 is a flow chart illustrating the steps used to practice the present invention.

FIG. 3 is a flow chart illustrating the steps used to practice the present invention.

Block 300 illustrates the step of thermally coupling a plate to the heat generating component.

Block 302 illustrates the step of passing a thermal carrier through an aperture in the plate, wherein the aperture is sized to prevent at least a first electromagnetic frequency from passing through the aperture and to provide heat dissipation to the heat generating component.

CONCLUSION

In summary, the present invention discloses an electromagnetic shielding heatsink with venting capabilities, comprising a heatsink block with multiple apertures, a thermal plate and a thermal coupler. The heatsink comprises a thermally and electrically conductive material. The aperture is coupled to the heatsink block electrically and thermally and allows a thermal carrier to pass from a first side of the heatsink block to a second side of the heatsink block. The aperture is sized to prevent electromagnetic frequencies lower than the cutoff frequency from passing through the aperture. The thermal coupler thermally connects the heatsink block to the thermal plate which in turn is thermally connected to a heat source.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An electromagnetic shielding heatsink with venting capabilities, comprising:
   a heatsink block comprising a base plate comprising thermally and electrically conductive material, and an extended surface having at least one aperture therethrough, wherein the extended surface extends beyond a wall thickness of the baseplate, the aperture allowing a thermal carrier to pass from a first side of the heatsink block to a second side of the heatsink block, wherein the aperture is sized to prevent an electromagnetic frequency lower than a cutoff frequency of the aperture from passing through the aperture and the extended surface is sized to provide adequate heat transfer;

at least one heat dissipating source;

at least one thermal plate thermally coupled to said heat dissipating source; and at least one thermal coupler comprising a thermally conductive material, for coupling said heatsink block to said thermal plate.

2. The heatsink of claim 1, wherein the heatsink block is a material selected from a group comprising copper and aluminum.

3. The heatsink of claim 1, wherein the thermal coupler is a heat pipe.

4. The heatsink of claim 1, wherein the thermal coupler is removably mounted to the heatsink block.

5. The heatsink of claim 1, wherein the thermal carrier is selected from a group comprising air, water, liquid, gas, and vapor.

6. An electromagnetic shielding heatsink with venting capabilities, comprising:
   a heatsink block comprising a base plate and an extended surface having at least one aperture therethrough, wherein the extended surface extends beyond a wall thickness of the baseplate, the aperture allowing a thermal carrier to pass from a first side of the heatsink block to a second side of the heatsink block, wherein the aperture is sized to prevent an electromagnetic frequency from passing through the aperture and the extended surface is sized to provide adequate heat transfer; and a thermal coupler comprising a thermally conductive material, for coupling a component to the heatsink block.

7. The heatsink of claim 6, wherein the thermal coupler couples a remote component to the heatsink block.

8. The heatsink of claim 7, wherein the thermal coupler is a heatpipe.

9. The heatsink of claim 6, wherein the heatsink block is a material selected from a group comprising copper and aluminum.

10. The heatsink of claim 6, wherein the thermal coupler is removably mounted to the heatsink block.

11. The heatsink of claim 6, wherein the thermal carrier is selected from a group comprising air, water, liquid, gas, and vapor.

12. The heatsink of claim 6, wherein the aperture is sized to prevent a group of electromagnetic frequencies lower than a cutoff frequency of the aperture from passing through the aperture.

* * * * *